United States Patent
Sakota (10) Patent No.: US 9,685,478 B2
(45) Date of Patent: Jun. 20, 2017

(54) FLIP-CHIP BONDING METHOD AND SOLID-STATE IMAGE PICKUP DEVICE MANUFACTURING METHOD CHARACTERIZED IN INCLUDING FLIP-CHIP BONDING METHOD

(71) Applicant: SHARP KABUSHIKI KAISHA, Osaka-shi, Osaka (JP)

(72) Inventor: Naoki Sakota, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/442,938

(22) PCT Filed: Oct. 2, 2013

(86) PCT No.: PCT/JP2013/076777
§ 371 (c)(1),
(2) Date: May 14, 2015

(87) PCT Pub. No.: WO2014/077044
PCT Pub. Date: May 22, 2014

(65) Prior Publication Data
US 2015/0303236 A1    Oct. 22, 2015

(30) Foreign Application Priority Data

Nov. 16, 2012  (JP) ................................ 2012-252542

(51) Int. Cl.
*H01L 31/14* (2006.01)
*H01L 33/48* (2010.01)
(Continued)

(52) U.S. Cl.
CPC ........ *H01L 27/14683* (2013.01); *H01L 24/75* (2013.01); *H01L 24/81* (2013.01);
(Continued)

(58) Field of Classification Search
CPC ................................ H01L 31/14; H01L 33/48
See application file for complete search history.

(56) References Cited

U.S. PATENT DOCUMENTS

| | | | |
|---|---|---|---|
| 6,309,954 B1 * | 10/2001 | Lake | H01L 24/11 257/E21.508 |
| 6,940,178 B2 * | 9/2005 | Kweon | H01L 23/49816 257/737 |
| 2003/0183947 A1 | 10/2003 | Ohuchi | |

FOREIGN PATENT DOCUMENTS

| JP | 2002-43354 | 2/2002 |
|---|---|---|
| JP | 2008-288327 | 11/2008 |

(Continued)

OTHER PUBLICATIONS

International Search Report for PCT/JP2013/076777 mailed Dec. 17, 2013, 2 pages.

(Continued)

*Primary Examiner* — Mohammad Choudhry
(74) *Attorney, Agent, or Firm* — Nixon & Vanderhye P.C.

(57) ABSTRACT

An electrode of an electronic component element (1) is bonded to an electrode (5) of a substrate (4) via a bump (2) by: after applying, to the bump (2), only a first pressure which is not less than a yield stress of a bulk material of which the bump (2) is made, reducing or stopping the application of the first pressure; and while applying a given ultrasonic vibration to the bump (2), gradually applying a pressure to the bump (2) until the pressure reaches a second pressure which is not less than the yield stress of the bulk material of which the bump (2) is made.

9 Claims, 6 Drawing Sheets

(51) Int. Cl.
*H01L 27/146* (2006.01)
*H01L 23/00* (2006.01)

(52) U.S. Cl.
CPC ........ *H01L 27/14618* (2013.01); *H01L 24/11* (2013.01); *H01L 24/13* (2013.01); *H01L 24/16* (2013.01); *H01L 2224/1134* (2013.01); *H01L 2224/13111* (2013.01); *H01L 2224/13144* (2013.01); *H01L 2224/16238* (2013.01); *H01L 2224/75251* (2013.01); *H01L 2224/75252* (2013.01); *H01L 2224/75343* (2013.01); *H01L 2224/8112* (2013.01); *H01L 2224/81047* (2013.01); *H01L 2224/81193* (2013.01); *H01L 2224/81205* (2013.01); *H01L 2224/81208* (2013.01); *H01L 2224/81986* (2013.01); *H01L 2924/15787* (2013.01)

(56) References Cited

FOREIGN PATENT DOCUMENTS

| JP | 2010-34527 | 2/2010 |
| JP | 4548059 | 7/2010 |
| JP | 2011-077093 | 4/2011 |

OTHER PUBLICATIONS

Written Opinion of the ISA for PCT/JP2013/076777 mailed Dec. 17, 2013, 3 pages.

* cited by examiner

FLIP-CHIP BONDING METHOD AND SOLID-STATE IMAGE PICKUP DEVICE MANUFACTURING METHOD CHARACTERIZED IN INCLUDING FLIP-CHIP BONDING METHOD

This application is the U.S. national phase of International Application No. PCT/JP2013/076777 filed Oct. 2, 2013, which designated the U.S. and claims priority to JP Patent Application No. 2012-252542 filed Nov. 16, 2012, the entire contents of each of which are hereby incorporated by reference.

TECHNICAL FIELD

The present invention relates to (i) a flip-chip bonding method for bonding an electrode of an electronic component element to a connecting terminal of a substrate via a protrusion electrode and (ii) a method for producing a solid-state image pickup apparatus, the method including the flip-chip bonding method.

BACKGROUND ART

A wire-bonding method has conventionally been used as a method for mounting an electronic component element such as a semiconductor element or a solid-state image pickup device on a substrate such as a circuit substrate or a package carrier. The wire-bonding method is a method for obtaining an electrical connection by bonding both ends of an extremely thin wire to respective electrodes of an electronic component element and a substrate.

However, a flip-chip bonding method, which has higher production efficiency, has recently been used. The flip-chip bonding method is a method for bonding an electrode of an electronic component element to an electrode (a bonding terminal) of a substrate via a bump (a protrusion electrode) which is an electrically conductive connecting member. The flip-chip bonding method makes it possible to collectively bond, via bumps, a plurality of parts to be bonded, and thus has an advantage of having higher production efficiency as compared with the wire-bonding method in which parts to be bonded are basically bonded one by one in sequence via an extremely thin wire. According to the flip-chip bonding method, electrodes which are bonding terminals of a substrate do not need to be provided close to an electronic component element. This makes it possible to greatly increase the number of bonding terminals, reduce an area for mounting the electronic component element, and shorten a wire length of a circuit. Accordingly, the flip-chip bonding method is suitable for, for example, high-density or high-speed mounting of electronic component elements.

Specific examples of the flip-chip bonding method encompass (i) a method for bonding a bump to an electrode of a substrate via an intermediate material such as an electric conductive paste and (ii) a method for directly bonding a bump to an electrode of a substrate by thermocompression bonding or thermocompression bonding with which an ultrasonic wave is used in combination. The method (ii) has an advantage of reducing the number of steps without the need to provide an intermediate material, and a further advantage of reducing time required for the bonding. Therefore, the thermocompression bonding (an ultrasonic flip-chip bonding method), with which an ultrasonic wave is used in combination, has recently been frequently used as the flip-chip bonding method.

According to the ultrasonic flip-chip bonding method, a bump is typically bonded to an electrode of a substrate by applying an ultrasonic vibration to the bump while a constant load is being applied to the bump.

The ultrasonic flip-chip bonding method has a problem of low reliability of an electric connection due to an insufficient bonding strength. The problem can be solved by a commonly known method for bonding a bump to an electrode of a substrate by gradually increasing a load and an output of an ultrasonic wave which are applied to the bump. According to the above bonding method, the load and the ultrasonic wave simultaneously start to be applied to the bump, and thus the ultrasonic wave is applied to the bump in a state in which a tip of the bump has not been sufficiently crushed. That is, the ultrasonic wave is applied in a state in which the bump is hardly bonded to the electrode of the substrate. This causes an electronic component element and the substrate to slip due to an ultrasonic vibration applied by an ultrasonic vibrator. Accordingly, the electronic component element is moved, so that the electronic component element and the substrate are relatively positionally displaced. In a case where the load and the output of the ultrasonic wave which are applied to the bump are both increased in such a state as described above, there occurs a problem such that the bump is bonded to the electrode of the substrate while respective parts of contact between the bump and the electrode of the substrate are positionally displaced.

Figure 6:
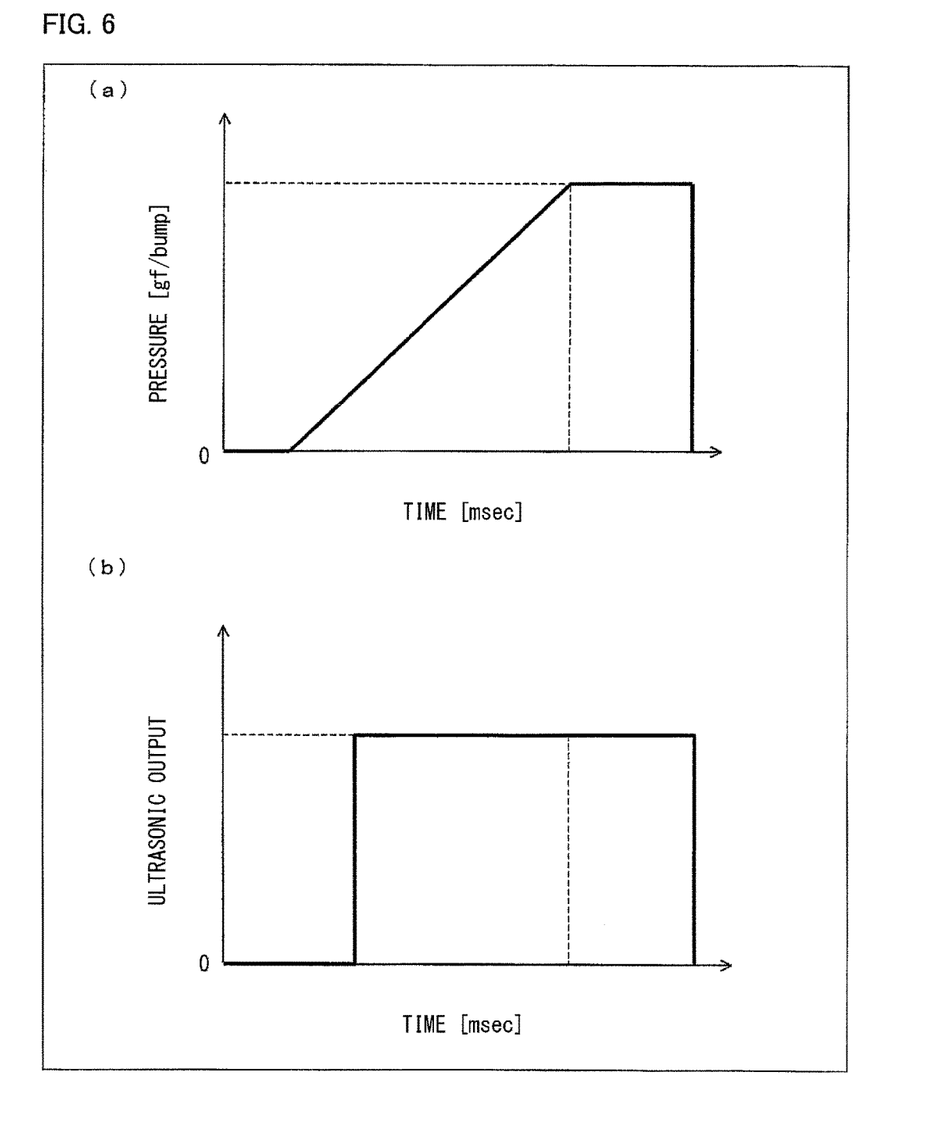
FIG. 6 illustrates a transition of an amount of a load to be applied and a transition of a state of output of an ultrasonic wave. (a) of FIG. 6 illustrates the transition of the amount of the load to be applied. (b) of FIG. 6 illustrates the transition of the state of output of the ultrasonic wave.

In view of the problem, Patent Literatures 1 and 2 each disclose a devised method for carrying out bonding excellent in bonding strength by bringing bumps into uniform contact with respective electrodes of a substrate. FIG. 6 illustrates a transition of an amount of a load to be applied and a transition of a state of output of an ultrasonic wave in a bonding method disclosed in Patent Literature 1. (a) of FIG. 6 illustrates the transition of the amount of the load to be applied. (b) of FIG. 6 illustrates the transition of the state of output of the ultrasonic wave. As illustrated in FIG. 6, the bonding method disclosed in Patent Literature 1 includes: (i) a first step of bringing a protrusion electrode of an electronic component element into contact with a pad electrode while increasingly applying a load to the protrusion electrode; (ii) a second step of fusion-bonding the protrusion electrode to the pad electrode by application of an ultrasonic vibration while increasingly applying a load to the protrusion electrode; and (iii) a third step of fusion-bonding the protrusion electrode to the pad electrode by application of an ultrasonic vibration while applying a constant load to the protrusion electrode. According to the disclosure in Patent Literature 1, even in a case where a difference in height occurs in the substrate or the bumps vary in height, the above bonding method makes it possible to carry out bonding excellent in bonding strength by bringing bumps into uniform contact with respective electrodes of a substrate.

Patent Literature 2 discloses a bonding method including: (i) a first step of, by lowering a bonding tool at a given speed while causing the bonding tool to apply an ultrasonic wave to a bump, controlling a speed at which the bump is crushed; and (ii) a second step of, after the first step, by applying a given pressing load to the bonding tool while causing the bonding tool to apply an ultrasonic wave to the bump, bonding the bump to a surface to be bonded. According to the disclosure in Patent Literature 2, the above bonding method makes it possible to gradually crush the bump and sufficiently transmit an ultrasonic vibration to a bonding surface, so that a higher bonding strength can be obtained.

CITATION LIST

Patent Literatures

Patent Literature 1

Japanese Patent Application Publication, Tokukai, No. 2002-43354 A (Publication Date: Feb. 8, 2002)

Patent Literature 2

Japanese Patent No. 4548059 A (Publication Date: Sep. 22, 2010)

SUMMARY OF INVENTION

Technical Problem

According to the bonding method disclosed in Patent Literature 1, since an ultrasonic vibration is applied to a bump while a load is being applied to the bump, a rigidity of the bump changes to be reduced at a moment at which the ultrasonic vibration is applied to the bump. Thus, the bump tends to be rapidly crushed in a very short time (a few msecs) immediately after the ultrasonic vibration is applied to the bump. Since it is impossible for a sufficient ultrasonic vibration to be sufficiently transmitted to a part of the bump, which part has been crushed at that time, the bump is insufficiently bonded to the substrate. That is, there is a problem of bonding of the bump to the substrate with a low bonding strength due to insufficient bonding of the substrate and a central part of the bump, which central part is to be crushed first.

The bonding method disclosed in Patent Literature 2, in which a central part of a bump may be bonded to a substrate, can be expected to allow a further increase in bonding strength as compared with the bonding method disclosed in Patent Literature 1. However, in a case where bumps vary in height or a substrate warps, the bumps are not uniformly pressed against respective electrodes (bonding terminals) of the substrate. This consequently causes the bumps to be differently bonded to the respective electrodes of the substrate, so that it is difficult to achieve a stable bonding state and reliability of an electrical connection.

Further, a pitch of electrodes tends to be made extremely shorter as various electronic component elements are smaller in size. It is possible to respond to such an extremely shorter pitch of electrodes by causing a bump to have a lower height as the bump has a smaller diameter. However, such a bump having a low height is clearly influenced by warpage of a substrate used for an electronic component element, so that a gap between the electronic component element and the substrate is partially narrow. This causes a problem such that, during a sealing step after flip-chip bonding, a sealing resin is less flowable in the gap between the electronic component element and the substrate and thus an air bubble remains in the gap.

The present invention has been made in view of the problems, and an object of the present invention is to provide (i) a flip-chip bonding method which allows an electrode of an electronic component element to be bonded to a connecting terminal of a substrate via a protrusion electrode so that the electrode of the electronic component element is in uniform contact with the connecting terminal of the substrate, and which allows the electrode of the electronic component element to be bonded to the connecting terminal with a favorable bonding strength, and (ii) a method for producing a solid-state image pickup apparatus, the method including the flip-chip bonding method.

Solution to Problem

In order to attain the object, a flip-chip bonding method in accordance with an aspect of the present invention is a flip-chip bonding method for bonding an electrode of an electronic component element to a connecting terminal of a substrate via a protrusion electrode, the flip-chip bonding method including: an alignment step of aligning the electronic component element with the substrate; a contact step of, after the alignment step, while heating at least one of the electrode of the electronic component element and the connecting terminal of the substrate, bringing the electrode of the electronic component element into contact with the connecting terminal of the substrate via the protrusion electrode; a first application step of, after the contact step, deforming a part of the protrusion electrode by applying no ultrasonic vibration to the protrusion electrode but applying, to the protrusion electrode, a first pressure which is not less than a yield stress of a bulk material of which the protrusion electrode is made; a reduction/stop step of reducing or stopping the application of the first pressure; and a second application step of, after the reduction/stop step, while applying a given ultrasonic vibration to the protrusion electrode, gradually applying a pressure to the protrusion electrode until the pressure reaches a second pressure which is not less than the yield stress of the bulk material of which the protrusion electrode is made.

In order to attain the object, a method for producing a solid-state image pickup apparatus in accordance with an aspect of the present invention includes a flip-chip bonding method mentioned above.

Additional objects, features, and strengths of the present invention will be made clear by the description below. Further, the advantages of the present invention will be evident from the following explanation in reference to the drawings.

Advantageous Effects of Invention

According to a flip-chip bonding method in accordance with an aspect of the present invention, protrusion electrodes are deformed in the first application step, so that the protrusion electrodes can be made uniform in height and have a height in conformity with warpage of substrates. That is, even in a case where the protrusion electrodes vary in height or the substrates vary in warpage, since the protrusion electrodes are directly brought into contact with the respective substrates in the first application step, the protrusion electrodes are made uniform in height by offsetting both the variation in height of the protrusion electrodes and the warpage of the substrates, so that the protrusion electrodes can be prevented from varying in height. In particular, according to the aspect of the present invention, no ultrasonic vibration is applied to the protrusion electrodes. This makes it possible to avoid excessive deformation of the protrusion electrodes which is caused by a reduction in rigidity of the protrusion electrodes due to an ultrasonic vibration.

According to the flip-chip bonding method in accordance with the aspect of the present invention, a part of a tip of a protrusion electrode is already deformed at the start of application to the protrusion electrode of an ultrasonic vibration. Thus, there is no fear that the protrusion electrode is rapidly crushed at a moment at which the ultrasonic vibration is applied to the protrusion electrode. As a result, even in a case where the ultrasonic vibration is applied to the protrusion electrode, the protrusion electrode has a sufficient area of contact between the protrusion electrode and a connecting terminal of a substrate. This makes it possible to efficiently form a newly-formed surface which contributes to bonding between the protrusion electrode and the connecting terminal of the substrate, so that a favorable bonding surface is formed between the protrusion electrode and the connecting terminal of the substrate. This causes protrusion electrodes to be uniformly pressed against respective connecting terminals of the substrate, so that an ultrasonic vibration can be sufficiently transmitted to all of the protrusion electrodes. This allows the protrusion electrodes to be strongly bonded to the respective connecting terminals of the substrate. According to the above flip-chip bonding method, which has higher productivity than a conventional flip-chip bonding method, even in a case where the connecting terminals of the electronic component element are minute, favorable bonding surfaces can be formed between the protrusion electrodes and the respective connecting terminals of the substrate, regardless of a variation in height of the protrusion electrodes or warpage of the substrate. This makes it possible to obtain bonding surfaces with high reliability of connection and high quality.

BRIEF DESCRIPTION OF DRAWINGS (a) of FIG. 1 is a view illustrating a state of bumps during an alignment step in accordance with an embodiment of the present invention. (b) of FIG. 1 is a view illustrating the state of the bumps during a contact step in accordance with the embodiment of the present invention. (c) of FIG. 1 is a view illustrating the state of the bumps during a first application step in accordance with the embodiment of the present invention.

(a) of FIG. 3 is a view illustrating a state of a bump which has not been subjected to flip-chip bonding in accordance with an embodiment of the present invention. (b) of FIG. 3 is a view illustrating the state of the bump which has been subjected to a first application step in accordance with an embodiment of the present invention. (c) of FIG. 3 is a view illustrating the state of the bump which has been subjected to a second application step in accordance with an embodiment of the present invention.

(a) of FIG. 5 is a view illustrating a state of a two-stage bump which has not been subjected to flip-chip bonding in accordance with an embodiment of the present invention. (b) of FIG. 5 is a view illustrating the state of the two-stage bump which has been subjected to the first application step in accordance with an embodiment of the present invention. (c) of FIG. 5 is a view illustrating the state of the bump which has been subjected to the second application step in accordance with an embodiment of the present invention.

DESCRIPTION OF EMBODIMENTS

An embodiment of the present invention is specifically described below with reference to the drawings. Note that in the following description, members having identical functions and operations are given respective identical reference numerals, and a description of those members is omitted.

(Outline of Flip-Chip Bonding)

Figure 2:
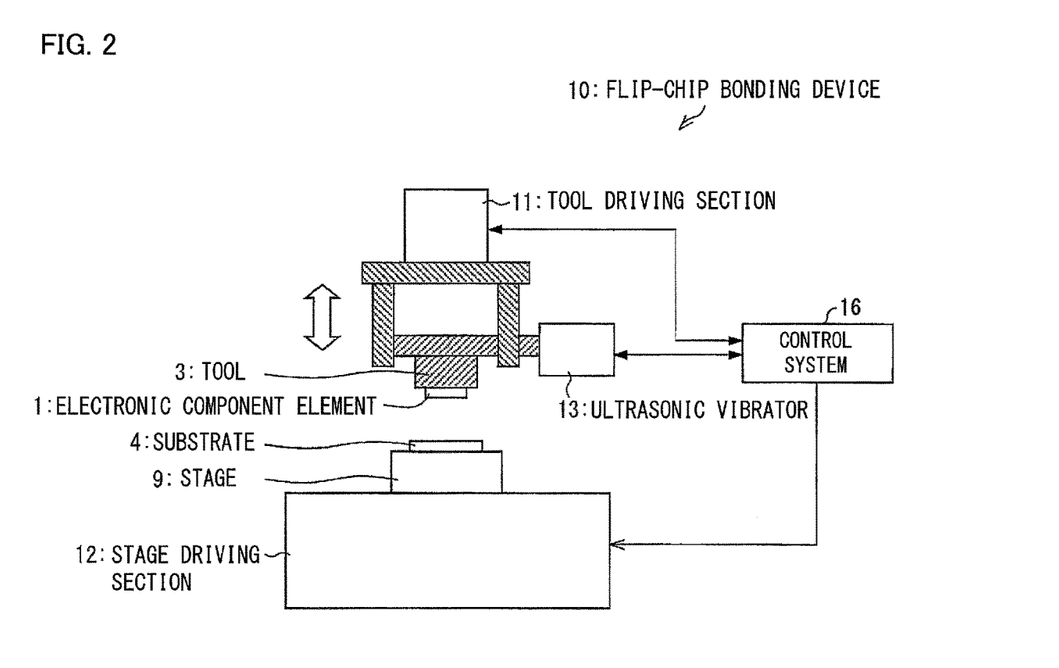
FIG. 2 is a view schematically illustrating a flip-chip bonding device in accordance with an embodiment of the present invention.

The present embodiment provides a method (an ultrasonic flip-chip bonding method) for bonding an electrode of an electronic component element such as a semiconductor element or a solid-state image pickup device to an electrode (a bonding terminal) of a substrate such as a circuit substrate or a package carrier via a bump (a protrusion electrode) by carrying out flip-chip bonding with which an ultrasonic wave is used in combination. First, the following description discusses, with reference to FIG. 2, an outline of flip-chip bonding in accordance with the present embodiment. FIG. 2 is a view schematically illustrating a flip-chip bonding device 10 in accordance with the present embodiment.

As illustrated in FIG. 2, the flip-chip bonding device 10 in accordance with the present embodiment includes: a tool 3 which vertically and horizontally moves while holding, by suction, an electronic component element 1; a stage 9 on which to place a substrate 4; a tool driving section 11 which drives the tool 3; a stage driving section 12 which drives the stage 9; an ultrasonic vibrator 13 which generates a given ultrasonic vibration; and a control system 16 which controls each of the tool driving section 11, the stage driving section 12, and the ultrasonic vibrator 13. The tool 3 can apply a pressure to the electronic component element 1 by vertically and horizontally moving and pressing the electronic component element 1 against the stage 9. In this case, the stage 9 can be also configured to be vertically and horizontally movable. The tool driving section 11, which is controlled by the control system 16, causes the tool 3 to vertically and horizontally move. Similarly, the stage driving section 12, which is also controlled by the control system 16, causes the stage 9 to vertically and horizontally move. Further, an ultrasonic vibration to be applied by the ultrasonic vibrator 13 to the electronic component element 1 is also controlled by the control system 16.

The tool 3 includes a heating section (not illustrated) and can heat, to a given temperature, the electronic component element 1 held by suction by the tool 3. Similarly, the stage 9 also includes a heating section (not illustrated) and can heat, to a given temperature, the substrate 4 placed on the stage 9. Note that both the tool 3 and the stage 9 do not need to include the heating section and at least one of the tool 3 and the stage 9 only needs to include the heating section.

The flip-chip bonding device 10 in accordance with the present embodiment is configured such that the electronic component element 1 held by suction by the tool 3 is aligned with the substrate 4 placed on the stage 9, and then electrodes provided on the electronic component element 1 are bonded, via bumps, to respective electrodes provided on the substrate 4. The substrate 4 has an opening at its central part, and the electrodes of the substrate 4 are provided inner than the opening. The flip-chip bonding device 10 is configured as below. According to the configuration, the control system 16 controls the tool driving section 11 so as to vertically and horizontally move the tool 3, so that the electronic component element 1 is positionally aligned with the opening part of the substrate 4. Then, the control system 16 controls the tool driving section 11 so as to further lower the tool 3 toward the stage 9, so that the electronic component element 1 is pressed against the stage 9. This causes the electrodes, which are provided inner than the opening of the substrate 4, to be bonded to the respective electrodes of the electronic component element 1. Note that the electrodes of the electronic component element 1 are bonded to the respective electrodes of the substrate 4 via the bumps, which are provided in advance on either the respective electrodes of the electronic component element 1 or the respective electrodes of the substrate 4. The following description is given assuming that the bumps are provided in advance on the respective electrodes of the electronic component element 1.

Though specifically described later, the flip-chip bonding device 10 is configured as below. According to the configuration, the control system 16 controls the tool driving section 11 first so as to lower, toward the stage 9, the tool 3 holding, by suction, the electronic component element 1 including the electrodes which are provided with the respective bumps, so that the bumps are flattened by pressing the electronic component element 1 against the stage 9 so as to apply a given pressure to the bumps. Note here that flattening of the bumps refers to an operation to subject the bumps to minute plastic deformation by applying a pressure to a plurality of bumps provided between the electrodes of the electronic component element 1 and the electrodes of the substrate 4. This allows the plurality of bumps which microscopically differ in size to be uniform in size. Thereafter, the control system 16 controls the tool driving section 11 again so as to temporarily raise the tool 3 upward. Thereafter, the plurality of bumps flattened are brought into contact with the respective electrodes of the substrate 4 again by lowering the tool 3 toward the stage 9. Then, the plurality of bumps are bonded to the respective electrodes of the substrate in a case where the control system 16 causes the ultrasonic vibrator 13 to apply a given ultrasonic vibration to each of the plurality of bumps while a pressure is being gradually applied to each of the plurality of bumps by pressing the electronic component element 1 against the stage 9.

(Details of Each Member)

The electrodes provided on the electronic component element are each obtained by forming, on a mounting surface of the electronic component element by, for example, sputtering, an electric conductive layer made of, for example, aluminum (Al)-silicon (Si). The electrodes provided on the electronic component element have dimensions of, for example, 70 µm×70 µm square and a thickness of 1 µm. Note that the electronic component element has a slightly larger size than the opening of the substrate.

The bumps are each a ball bump made of, for example, a gold (Au) wire and formed in a ball shape on a corresponding electrode provided on the electronic component element. The bump has dimensions of, for example, a diameter of 60 µm and a height of approximately 40 µm to 45 µm. Due to an error occurring during forming of the bumps on the respective electrodes of the electronic component element, the bumps are non-uniform in height and vary in height.

The substrate has an opening at its center. The opening opens more widely than a pixel area in a case where the electronic component element is a solid-state image pickup device. The substrate may be a ceramic substrate or an organic substrate made of an insulating material such as a glass cloth epoxy resin, an aramid fiber nonwoven fabric epoxy resin, or a liquid crystal polymer resin. In a case where the substrate is a ceramic substrate, an electrode (a bonding terminal) to be formed on the substrate is formed by sequentially plating a wire made of, for example, tungsten (W) and formed on the substrate with, for example, nickel (Ni) and Au. Note that Au with which an outermost layer of the electrode is to be plated is plated by, for example, an electroless plating method so as to have a thickness of 0.5 µm.

(Details of Flip-Chip Bonding Method)

The flip-chip bonding method in accordance with the present embodiment includes the following steps (a) through (e):

(a) an alignment step of aligning an electronic component element with a substrate;

(b) a contact step of, after the alignment step, while heating at least one of the electronic component element and the substrate, bringing an electrode of the electronic component element into contact with an electrode (a connecting terminal) of the substrate via a bump (a protrusion electrode);

(c) a first application step of, after the contact step, deforming a part of the bump by applying no ultrasonic vibration to the bump but applying, to the bump, a first pressure which is not less than a yield stress of a bulk material of which the bump is made;

(d) a reduction/stop step of reducing or stopping the application of the first pressure; and (e) a second application step of, after the reduction/stop step, while applying a given ultrasonic vibration to the bump, gradually applying a pressure to the bump until the pressure reaches a second pressure which is not less than the yield stress of the bulk material of which the bump is made.

Figure 1:
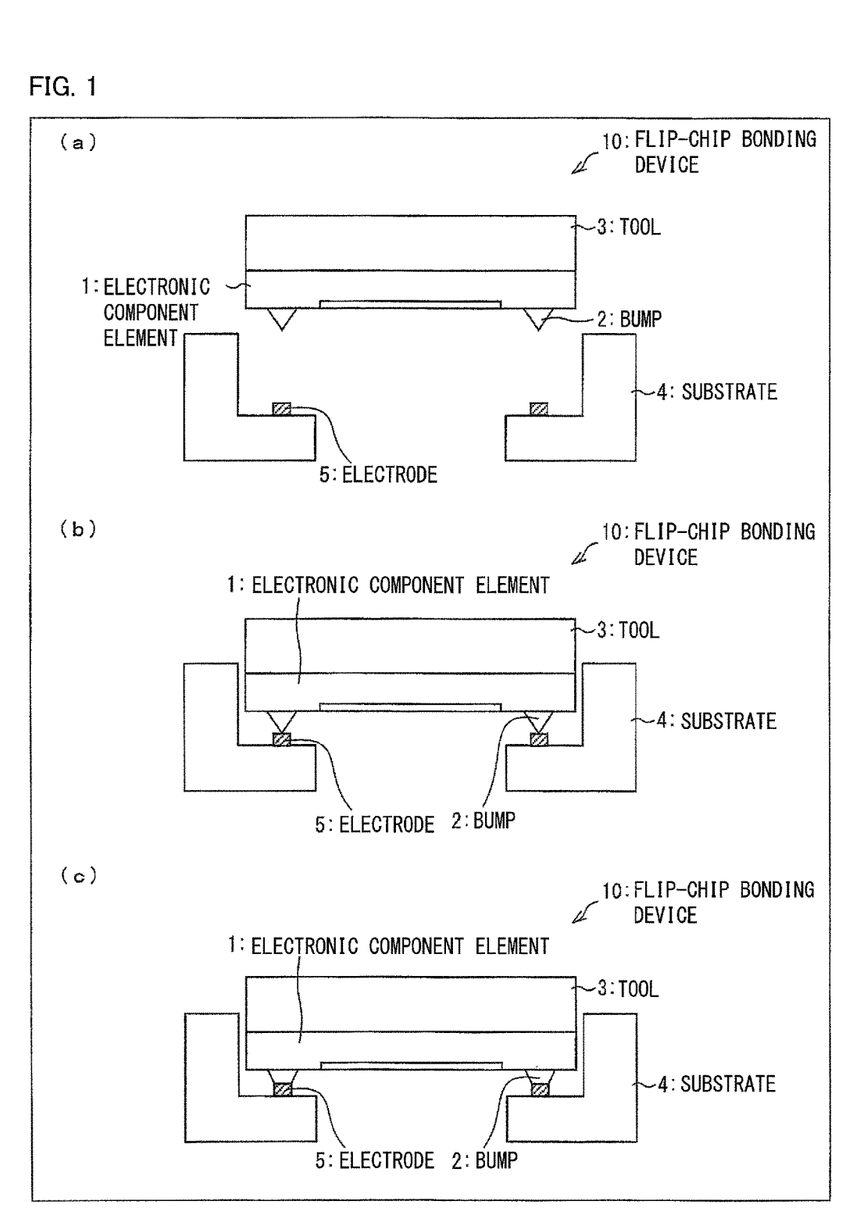
Figure 3:
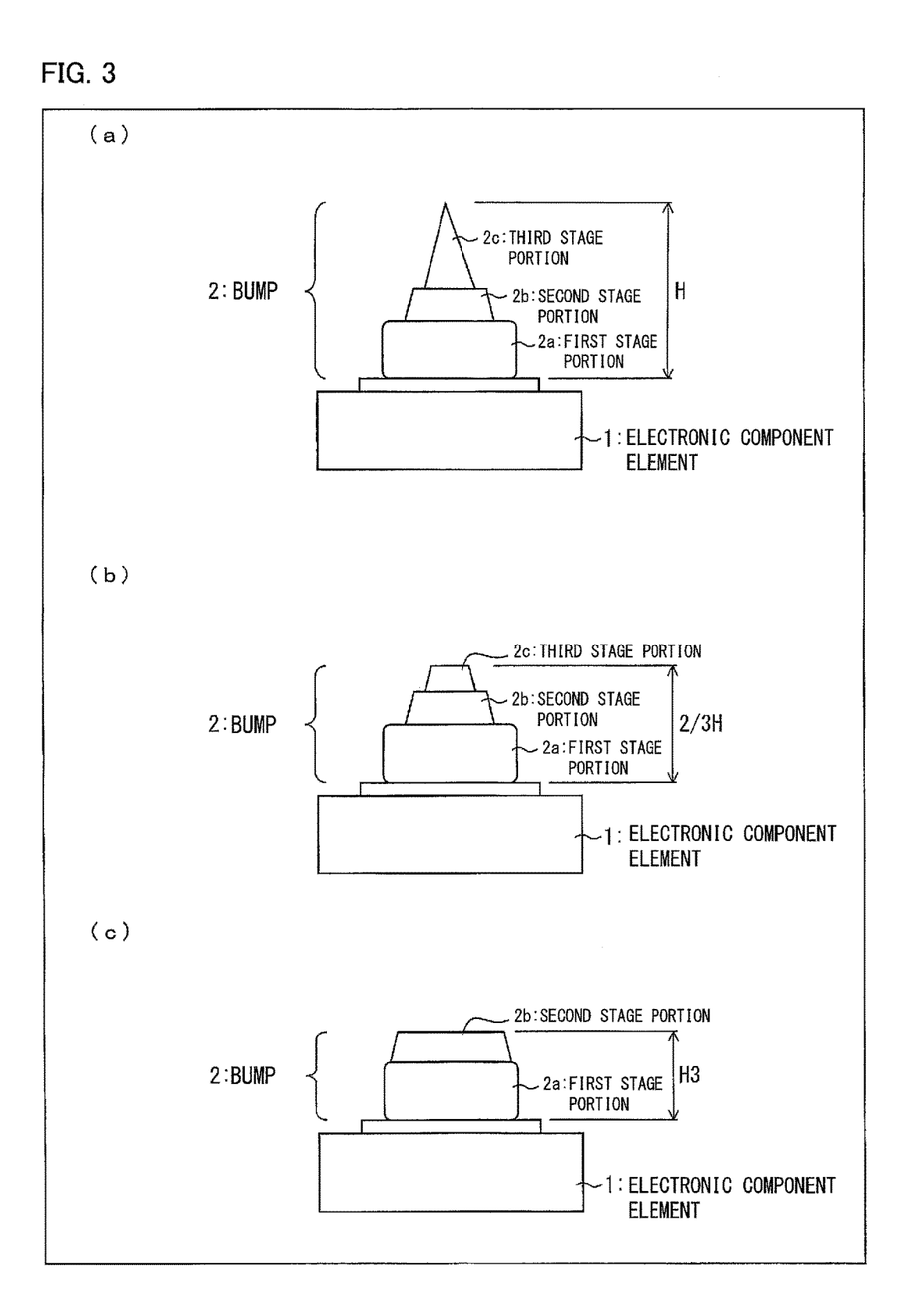
Figure 4:
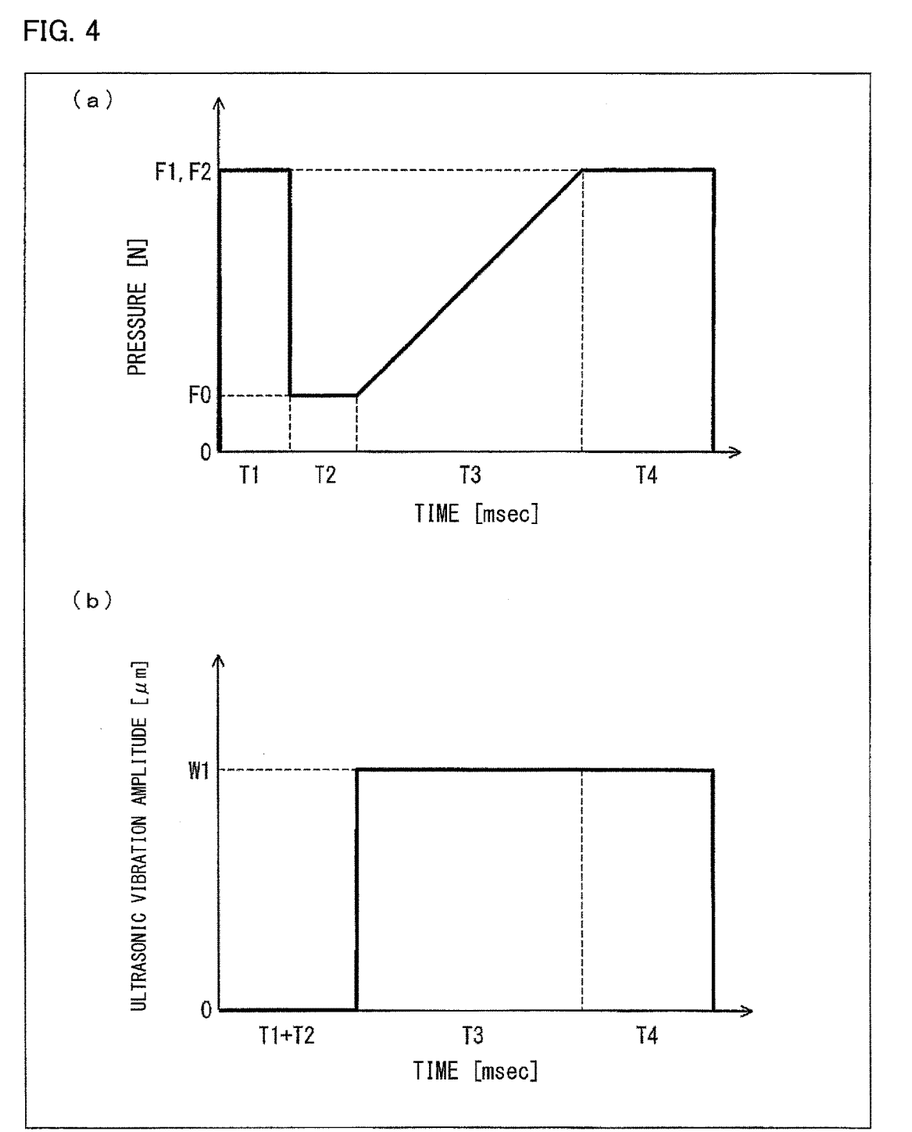
FIG. 4 illustrates respective transitions of a pressure and an ultrasonic vibration which are to be applied in a flip-chip bonding method in accordance with an embodiment of the present invention. (a) of FIG. 4 illustrates a transition of the pressure to be applied. (b) of FIG. 4 illustrates a transition of the ultrasonic vibration to be applied.

The following specifically discusses the above steps (a) through (e) with reference to FIGS. 1, 3, and 4. (a) of FIG. 1 is a view illustrating a state of bumps during the alignment step. (b) of FIG. 1 is a view illustrating the state of the bumps during the contact step. (c) of FIG. 1 is a view illustrating the state of the bumps during the first application step. (a) of FIG. 3 is a view illustrating a state of a bump which has not been subjected to flip-chip bonding. (b) of FIG. 3 is a view illustrating the state of the bump which has been subjected to the first application step. (c) of FIG. 3 is a view illustrating the state of the bump which has been subjected to the second application step. FIG. 4 illustrates respective transitions of a pressure and an ultrasonic vibration which are to be applied in a flip-chip bonding method in accordance with the present embodiment. (a) of FIG. 4 illustrates a transition of the pressure to be applied. (b) of FIG. 4 illustrates a transition of an amplitude of the ultrasonic vibration to be applied.

First, (i) the electronic component element 1 in which bumps 2 are provided on respective electrodes and (ii) the substrate 4 are prepared (see (a) of FIG. 1). Specifically, the electronic component element 1 is held by suction by the tool 3 of the flip-chip bonding device 10, and the substrate 4 is placed on the stage. (a) of FIG. 3 is an enlarged view of a bump 2 in this case. As illustrated in (a) of FIG. 3, the bump 2, which is provided on a corresponding electrode of the electronic component element 1, has a protrusion having a height H. Note here that the bump 2 is made up of a first stage portion 2a through a third stage portion 2c which are formed by a capillary used to form a ball bump. The first stage portion 2a is a stage portion corresponding to a pedestal part of the bump 2. The second stage portion 2b is a stage portion having a shape formed by the capillary. The third stage portion 2c, which is a tip obtained by cutting a gold wire bump, is a stage portion having a shape formed by the capillary used.

Subsequently, while the electronic component element is being held by suction by the tool 3, the control system 16 controls the tool driving section 11 so as to vertically and horizontally move the tool 3, so that the electronic component element 1 is aligned with the substrate 4 placed on the stage (the alignment step). Specifically, the electronic component element 1 is positionally aligned with the opening of the substrate 4 so that the bumps 2 provided on the electronic component element 1 face respective electrodes 5 provided on the substrate 4.

The control system 16 controls the tool driving section 11 in this state so as to lower the tool 3 toward the stage 9, so that the electrodes of the electronic component element 1 are brought into contact with the respective electrodes 5 of the substrate 4 via the bumps 2 as illustrated in (b) of FIG. 1 (the contact step). In this case, the heating section which is provided in at least one of the tool 3 and the stage 9 heats, to a given temperature, at least one of the electrodes of the electronic component element 1 and the electrodes 5 of the substrate 4.

Then, the control system 16 controls the tool driving section 11 so as to further lower the tool 3 toward the stage 9, so that, as illustrated in (c) of FIG. 1, by pressing the electronic component element 1 against the stage 9, a first pressure which is not less than a yield stress of a bulk material of which the bumps 2 are made is applied to the bumps 2 of the electronic component element 1 (the first application step). The yield stress is a stress at a yield point (a point at which a permanent distortion starts to occur with little change in stress when an object is rapidly increasingly deformed in response to a gradual increase in application of an external force to the object). In this case, the control system 16 controls the tool driving section 11 so that the tool 3 applies a first pressure F1 to the bumps 2 for a time T1 ((a) of FIG. 4). The control system 16 controls an ultrasonic vibrator so that no ultrasonic vibration is applied to the bumps 2 ((b) of FIG. 4). This step causes all of the bumps 2 provided on the respective electrodes of the electronic component element 1 to be partially deformed. (b) of FIG. 3 is an enlarged view of a bump 2 in this case. As illustrated in (b) of FIG. 3, a tip (the third stage portion 2c) of the bump 2 is partially crushed. Due to an error occurring during forming of the bumps 2 on the respective electrodes of the electronic component element 1, the bumps 2 vary in height or the substrate 4 warps. According to the present embodiment, the bumps 2 are deformed in the first application step, so that the bumps 2 can be made uniform in height and have a height in conformity with the warpage of the substrate 4. That is, even in a case where the bumps 2 vary in height or the substrate 4 warps, the bumps 2 are made uniform in height by offsetting both the variation in height of the bumps 2 of the electronic component element 1 and the warpage of the substrate 4, so that the bumps 2 can be prevented from varying in height. In particular, according to the present embodiment, no ultrasonic vibration is applied to the bumps 2. This makes it possible to avoid excessive deformation of the bumps 2 which is caused by a reduction in rigidity of the bumps 2 due to an ultrasonic vibration. Further, bonding surfaces on which all of the bumps 2 provided in the electronic component element 1 are in contact with the respective electrodes 5 of the substrate 4 can have areas of contact between all of the bumps 2 of the electronic component element 1 and the respective electrodes 5 of the substrate 4. This makes it possible to efficiently apply an ultrasonic vibration to all of the bonding surfaces.

In this case, the first pressure F1 applied by the tool 3 to the bump 2 is preferably a pressure at which to deform a part of the bump 2 which part is substantially one third in length of the bump 2 from the tip of the bump 2. That is, the first pressure F1 is preferably a pressure at which to deform the tip of the bump 2 until the bump 2 has a height of two-thirds H. More specifically, it is preferable to deform one third or more of the bump 2 that faces a part of the substrate 4 which part is largest in warpage. This allows the bumps 2 to be flattened while the bumps 2 can have a sufficient height and the flattened bumps 2 and the respective electrodes 5 of the substrate 4 can have a sufficient area of contact therebetween. Specifically, the application of the first pressure to the bumps 2 allows a center of deformation in a height direction and a width direction of the bumps 2 to be fixed between the bumps 2 and the respective electrodes 5 of the substrate 4. In a case where the center of deformation is insufficiently fixed, a distortion with respect to a direction of an ultrasonic vibration occurs in the bumps 2. This causes the bumps 2 to incline and be non-uniform in shape, so that the electrodes of the electronic component element 1 are unstably bonded to the respective electrodes 5 of the substrate 4. In view of this, the deformation of the bumps 2 in the first application step makes it possible to form a strong bonding surface between the electrodes of the electronic component element 1 and the respective electrodes 5 of the substrate 4.

The bumps 2, which have a sufficient height, can prevent a gap between the electronic component element 1 and the substrate 4 from being partially narrow by being influenced by the warpage of the substrate 4. That is, it is possible to prevent a problem such that, during a sealing step after flip-chip bonding, a sealing resin is less flowable in the gap between the electronic component element 1 and the substrate 4 and thus an air bubble remains in the gap. For example, in a case where the bumps 2 are made of Au, it is preferable to apply a pressure of 0.25N to 0.3N to each of the bumps 2.

After the first application step, the control system 16 controls the tool driving section 11 so as to raise the tool 3 in an opposite direction to the stage 9, so that by reducing or stopping pressing of the electronic component element 1 against the stage 9, the application of the first pressure F1 to the bump 2 of the electronic component element 1 is reduced or stopped (the reduction/stop step). This reduction/stop step is continued only for a time T2 ((a) of FIG. 4). In a case where the application of the first pressure F1 to the bump 2 is temporarily terminated, a newly-formed surface of a bulk material can be efficiently formed on a flattened surface of the bump 2 by an amplitude of an ultrasonic vibration in the second application step (described later), so that an entire surface of the bump 2 adheres to the electrode 5 of the substrate 4. Unless the application of the first pressure F1 is reduced or stopped here, it is difficult for a central part of the flattened bump 2 to be bonded to the electrode 5 of the substrate 4, so that only a peripheral part of the bump 2 is bonded to the electrode 5 of the substrate 4. Accordingly, the first application step and the reduction/stop step described above are necessary for (i) forming a favorable bonding surface between (a) the bump 2 having a shape based on that of the electrode 5 of the substrate 4 and (b) the electrode 5 of the substrate 4 and (ii) bonding the bump 2 to the electrode 5 of the substrate 4 with a higher bonding strength.

Subsequently, while causing the ultrasonic vibrator to apply a given ultrasonic vibration to the bump 2 of the electronic component element 1, the control system 16 controls the tool driving section 11 so as to lower the tool 3 toward the stage 9 again, so that by pressing the electronic component element 1 against the stage 9, a pressure is gradually applied to the bump 2 of the electronic component element 1 until the pressure reaches a second pressure which is not less than a yield stress of the bulk material of which the bump 2 is made (the second application step). A second pressure F2 (e.g., 0.25N to 0.4N) is a pressure greater than or equal to the first pressure F1. In this case, the control system 16 causes the ultrasonic vibrator to apply, to the bump 2 for a time T3, an ultrasonic vibration having a given ultrasonic vibration amplitude W ((b) of FIG. 4). By controlling the tool driving section 11, the control system 16 controls the tool 3 so that the pressure applied to the bump 2 gradually reaches the second pressure F2 during the time T3 ((a) of FIG. 4). This step further deforms the bump 2 of the electronic component element 1, so that the bump 2 has a height H3 that is less than two-thirds H (see (c) of FIG. 3). Simultaneously with this, an area of contact between the bump 2 and an electrode terminal of the substrate 4 is increased by continuously forming a newly-formed surface of the bump 2, so that a bonding surface is formed between the bump 2 of the electronic component element 1 and the electrode terminal of the substrate 4. Note that the ultrasonic vibration amplitude W is not particularly limited in value. The ultrasonic vibration amplitude W can be set to an appropriate value in accordance with materials of which the electrode of the electronic component element 1, the bump 2, and the electrode 5 of the substrate 4 are made.

In this case, a part of the tip (the third stage portion 2c) of the bump 2 is already deformed at the start of the application to the bump 2 of the ultrasonic vibration having the ultrasonic vibration amplitude W. Thus, there is no fear that the bump 2 is rapidly crushed at a moment at which the ultrasonic vibration having the ultrasonic vibration amplitude W is applied to the bump 2. As a result, even in a case where the ultrasonic vibration having the ultrasonic vibration amplitude W is applied to the bump 2, a favorable bonding surface is formed between the bump 2 and the electrode 5 of the substrate 4. This causes the bumps 2 to be uniformly pressed against the respective electrodes 5 of the substrate 4, so that an ultrasonic vibration can be sufficiently transmitted to all of the bumps 2. This allows the bumps 2 to be strongly bonded to the respective electrodes 5 of the substrate 4.

Lastly, the control system 16 maintains, for a time T4, (i) the pressure applied to the bump 2 of the electronic component element 1 at the second pressure F2 ((a) of FIG. 4) and (ii) the ultrasonic vibration applied to the bump 2 at the ultrasonic vibration amplitude W ((b) of FIG. 4). Thereafter, the control system 16 controls the tool driving section 11 so as to raise the tool 3 in the opposite direction to the stage 9, so that by stopping pressing of the electronic component element 1 against the stage 9, the application of the second pressure F2 to the bump 2 of the electronic component element 1 is stopped. Similarly, the control system 16 controls the ultrasonic vibrator so as to stop applying the ultrasonic vibration having the ultrasonic vibration amplitude W. With this, a series of steps of bonding the electrode of the electronic component element 1 to the electrode 5 of the substrate 4 via the bump 2 is ended.

(Modified Example)

The substrate 4 used for an electronic component has an opening. Thus, in many cases, a surface of the substrate 4, on which surface the electronic component element 1 is to be mounted, is not a completely flat surface but a surface which is wavy and partially has a difference in height of several tens of μm. Accordingly, in a case where the electronic component element 1 is mounted on the substrate 4, in some cases, all of the bumps 2 are not necessarily in uniform contact with the respective electrodes 5 of the substrate 4 at respective contact surfaces and some of the bumps 2 are not in contact with the respective electrodes 5, i.e., the bumps 2 and the respective electrodes 5 are in a state of so-called partial contact. In a case where an ultrasonic vibration is applied to the bumps 2 in such a state, the ultrasonic vibration is concentratedly transmitted to some of the bumps 2 which are in proper contact with the respective electrodes 5 of the substrate 4. Further, the bumps 2 and the respective electrodes 5 have some gaps therebetween. This causes a play on a contact surface on which the electronic component element 1 is in contact with the substrate 4. As a result, the electronic component element 1 is not properly bonded to the substrate 4, so that the electronic component element 1 is highly likely to incline toward the substrate 4. An electronic component having an inclination results in a defective product.

Figure 5:
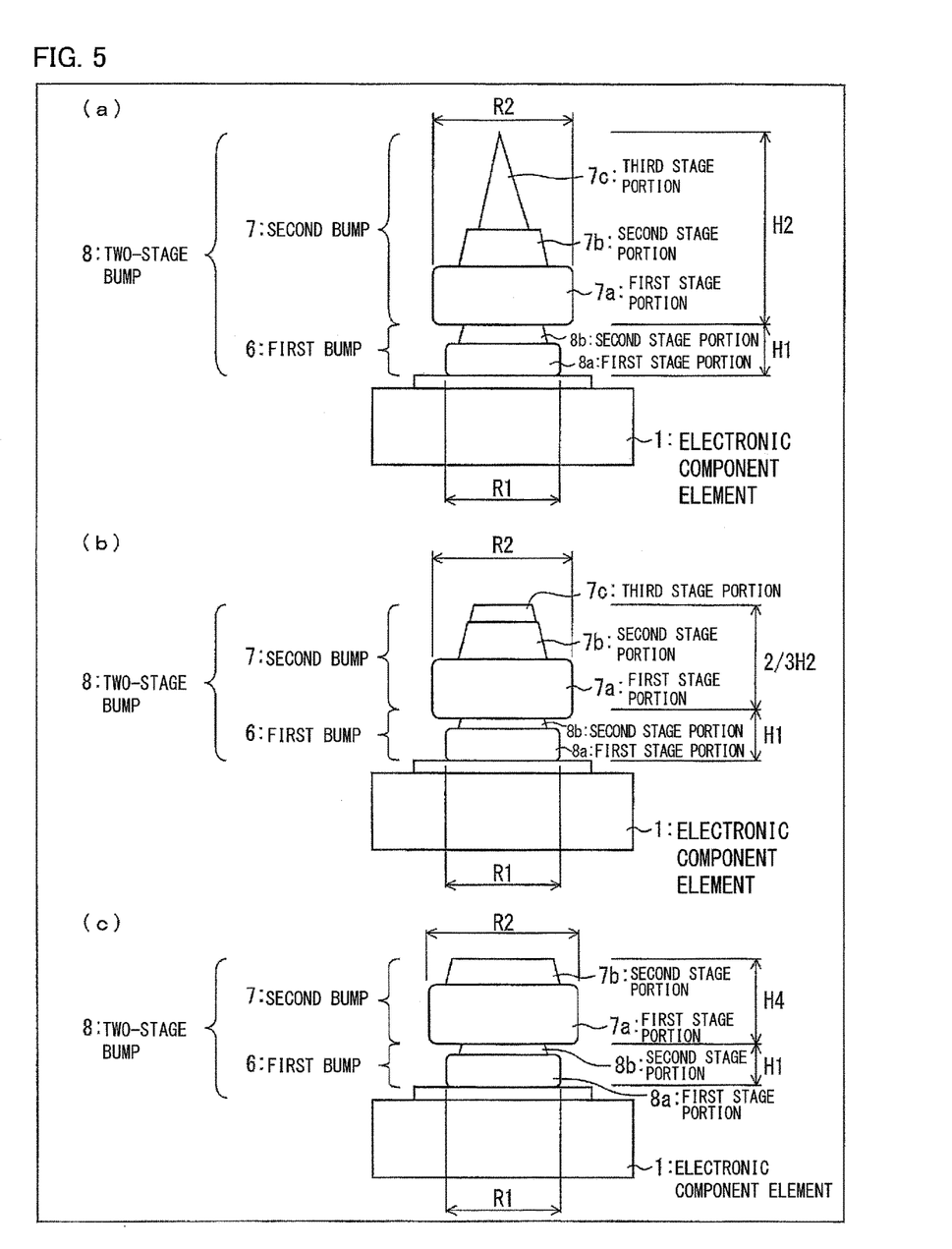

Under the circumstances, favorable bonding of the bumps 2 to the respective electrodes 5 of the substrate 4 by the ultrasonic flip-chip bonding method requires the bumps 2 to be in contact with the respective electrodes 5 of the substrate 4 under a proper condition necessary for the bonding. Specifically, in the case of the electronic component element 1 having many bumps 2, all of the bumps 2 need to be in uniform contact with the respective electrodes 5 of the substrate 4. In view of this, the bonding excellent in bonding strength can be stably carried out by preferably using, as the bumps 2, two-stage bumps each made up of a first bump and a second bump. In a case where the two-stage bumps are used as the bumps 2, the bumps 2 totally have a high height. This allows absorption of warpage of the substrate 4, so that the electronic component element 1 and the substrate 4 can be prevented from being excessively close to each other. FIG. 5 is an enlarged view of a two-stage bump. (a) of FIG. 5 is a view illustrating a state of a two-stage bump which has not been subjected to flip-chip bonding. (b) of FIG. 5 is a view illustrating the state of the two-stage bump which has been subjected to the first application step. (c) of FIG. 5 is a view illustrating the state of the two-stage bump which has been subjected to the second application step.

As illustrated in (a) of FIG. 5, a two-stage bump 8 is made up of a first bump 6 and a second bump 7 stacked on the first bump 6. The following description briefly discusses a method for producing the two-stage bump 8. First, an ultrasonic vibration is applied to a publicly-known metal ball which is being pressed, so that a metal wire is cut. The first bump 6 is thus formed. Thereafter, another metal ball is similarly bonded to the first bump 6, a tip of a capillary is moved in a horizontal direction, and then an ultrasonic vibration is applied to the metal ball, so that the metal wire is cut. The second bump 7 is thus formed, so that the two-stage bump 8 is completed. Note here that the first bump 6 is made up of a first stage portion 8a and a second stage portion 8b and the second bump 7 is made up of a first stage portion 7a through a third stage portion 7c. The first stage portion 8a and the second stage portion 8b, and the first stage portion 7a through the third stage portion 7c are each formed by a capillary used to form a ball bump. The first stage portion 8a is a stage portion corresponding to a pedestal part of the first bump 6. The second stage portion 8b, which is a part contributing to a connection between the first bump 6 and the second bump 7, is a stage portion having a shape formed by the capillary used. The second stage portion 8b has been deformed by the connection between the first bump 6 and the second bump 7. Meanwhile, the first stage portion 7a is a stage portion corresponding to a pedestal part of the second bump 7. The second stage portion 7b is a stage portion having a shape formed by the capillary. The third stage portion 7c, which is a tip obtained by cutting a gold wire bump, is a stage portion having a shape formed by the capillary used.

The two-stage bump 8 is preferably configured such that H1 which is a height of the first bump 6 is lower than H2 which is a height of the second bump 7, and R1 which is a diameter of the first bump 6 is smaller than R2 which is a diameter of the second bump 7. More specifically, it is preferable to (i) deform one third or more of the bump 2 that faces a part of the substrate 4 which part is largest in warpage and (ii) deform the second bump 7 so that the second bump 7 has a diameter that is not less than one sixth and not more than one third of the diameter of the first bump 6. This causes deformation of the second bump 7 to be a principal factor in bonding and allows the first bump 6 which is not excessively deformed to serve as a stopper for securing an overall height of the two-stage bump 8. In particular, since the first bump 6 cannot be excessively deformed from the viewpoint of damage to the electrode of the electronic component element 1, the second bump 7 serves as a principal factor in the deformation. In order to cause the second bump 7 to serve as a principal factor in the deformation, it is preferable not to allow deformation of the first bump 6, i.e., to prevent deformation of the first bump 6 by causing the first bump 6 to have a lower height than the second bump 7. The first bump 6 has dimensions of, for example, a diameter of 60 μm and a height of approximately 30 μm to 40 μm. The second bump 7 stacked on the first bump 6 has dimensions of, for example, a diameter of 65 μm to 70 μm and a height of 40 μm to 50 μm.

Note that, since the second bump 7 is a principal factor in the deformation and the bonding, the electrode 5 of the substrate 4 which electrode 5 faces the second bump 7 is preferably larger than the electrode of the electronic component element 1. In a case where a ceramic substrate is used as a substrate of the electronic component element 1, the electrode has a semicylindrical shape, so that it is difficult for the electrode to be flat. Therefore, the electrode 5 of the substrate 4 is preferably larger than the electrode of the electronic component element 1.

The present modified example is similar to the above embodiment, except that the present modified example uses the two-stage bump 8 as a bump. Accordingly, as illustrated in (b) of FIG. 5, a part of the tip (third stage portion 7c) of the two-stage bump 8 is deformed in the first application step. In this case, a first pressure applied by the tool 3 to the two-stage bump 8 is preferably a pressure at which to deform a part of the two-stage bump 8 which part is one third in length of the two-stage bump 8 from the tip of the second bump 7. That is, the first pressure is preferably a pressure at which to deform the tip (third stage portion 7c) of the second bump 7 until the second bump 7 has a height of two-thirds H2. For example, in a case where the two-stage bump 8 is made of Au, it is preferable to apply a pressure of 0.25N to 0.3N to the two-stage bump 8.

The bump which is the two-stage bump 8 has a high height. Accordingly, in a case where second bumps 7 are deformed in the first application step, two-stage bumps 8 can be made uniform in height and have a height in conformity with warpage or waviness of the substrate 4. That is, even in a case where the two-stage bumps 8 vary in height or the substrate 4 warps or waves, the two-stage bumps 8 are made uniform in height by offsetting both a variation in height of the two-stage bumps 8 of the electronic component element 1 and the warpage or waviness of the substrate 4, so that the two-level bumps 8 can be prevented from varying in height. As illustrated in (c) of FIG. 5, the second application step causes the second bump 7 to intrude into the first bump 6, so that the second bump 7 of the two-stage bump 8 has a height H4 that is less than two-thirds H2. This allows the first bump 6 to adhere to the second bump 7 and allows a favorable bonding surface to be formed between the two-stage bump 8 and the electrode 5 of the substrate 4. In particular, according to the present modified example, the first bump 6 and the second bump 7, which are made of a single kind of material, are favorably bonded to each other.

Further, the present modified example, in which the two-stage bump 8 is used as the bump, allows a gap between the electronic component element 1 and the substrate 4 to be more easily formed as compared with the above embodiment. This allows the two-stage bump 8 to be flattened while the two-stage bump 8 can have a sufficient height. The two-stage bump 8, which has a sufficient height, can prevent the gap between the electronic component element 1 and the substrate 4 from being partially narrow by being influenced by the warpage of the substrate 4. That is, during a sealing step after flip-chip bonding, the electronic component element 1 and the substrate 4 have a wide gap therebetween and thus a sealing resin is more flowable. This makes it possible to prevent a problem such that an air bubble remains in the gap.

According to a conventional ultrasonic flip-chip bonding method, a bump which is a two-stage bump has a high height, so that the bump which is applied with an ultrasonic vibration is highly likely to incline. This is because of the following reason. That is, since the bump has a high height while having a constant base diameter, the bump which is applied with the ultrasonic vibration, which is a transverse vibration, violently vibrates, so that, the two-stage bump more easily buckles, i.e., the two-stage bump itself more easily inclines, as compared with a one-stage bump having a low height. However, according to the present modified example, the second bump 7 has been deformed before the ultrasonic vibration is applied to the second bump 7. This allows all of the two-stage bumps 8 to have areas of contact with the respective electrodes 5 of the substrate 4.

(Operational Advantages)

According to a flip-chip bonding method in accordance with an aspect of the present invention, all bumps are made uniform in size by flattening the bumps in a first application step. In particular, according to an aspect of the present invention, since no ultrasonic vibration is applied to the bumps, it is possible to avoid excessive deformation of the bumps which is caused by a reduction in rigidity of the bumps due to an ultrasonic vibration.

According to a flip-chip bonding method in accordance with an aspect of the present invention, a part of a tip of a bump is already deformed at the start of application to the bump of an ultrasonic vibration. Thus, there is no fear that the bump is rapidly crushed at a moment at which the ultrasonic vibration is applied to the bump. As a result, even in a case where the ultrasonic vibration is applied to the bump, the bump has a sufficient area of contact between the bump and an electrode of a substrate. This makes it possible to efficiently form a newly-formed surface which contributes to bonding between the bump and the electrode of the substrate, so that a favorable bonding surface is formed between the bump and the electrode of the substrate. This causes bumps to be uniformly pressed against respective electrodes of the substrate, so that an ultrasonic vibration can be sufficiently transmitted to all of the bumps. This allows the bumps to be strongly bonded to the respective electrodes of the substrate. According to the above flip-chip bonding method, which has higher productivity than a conventional flip-chip bonding method, even in a case where the electrodes of the electronic component element are minute, favorable bonding surfaces can be formed between the bumps and the respective electrodes of the substrate, regardless of a variation in height of the bumps or warpage of the substrate. This makes it possible to obtain bonding surfaces with high reliability of connection and high quality.

In particular, according to an aspect of the present invention, two-stage bumps which are used as the bumps are made uniform in height during crushing of the two-stage bumps (the first application step) so as to be in conformity with a state of surfaces of the electrodes of the substrate. Therefore, the two-stage bumps can be bonded to the respective electrodes of the substrate while being in conformity with warpage or waviness of the substrate. An aspect of the present invention thus provides a flip-chip bonding method which is strong in warpage or waviness of a substrate.

The present invention is not limited to the description of the embodiments above, but may be altered by a skilled person within the scope of the claims. An embodiment based on a proper combination of technical means disclosed in different embodiments is encompassed in the technical scope of the present invention.

CONCLUSION

A flip-chip bonding method in accordance with an aspect of the present invention is a flip-chip bonding method for bonding an electrode of an electronic component element to a connecting terminal of a substrate via a protrusion electrode, the flip-chip bonding method including: an alignment step of aligning the electronic component element with the substrate; a contact step of, after the alignment step, while heating at least one of the electrode of the electronic component element and the connecting terminal of the substrate, bringing the electrode of the electronic component element into contact with the connecting terminal of the substrate via the protrusion electrode; a first application step of, after the contact step, deforming a part of the protrusion electrode by applying no ultrasonic vibration to the protrusion electrode but applying, to the protrusion electrode, a first pressure which is not less than a yield stress of a bulk material of which the protrusion electrode is made; a reduction/stop step of reducing or stopping the application of the first pressure; and a second application step of, after the reduction/stop step, while applying a given ultrasonic vibration to the protrusion electrode, gradually applying a pressure to the protrusion electrode until the pressure reaches a second pressure which is not less than the yield stress of the bulk material of which the protrusion electrode is made.

According to the method, protrusion electrodes are deformed in the first application step, so that the protrusion electrodes can be made uniform in height and have a height in conformity with warpage of substrates. That is, even in a case where the protrusion electrodes vary in height or the substrates vary in warpage, since the protrusion electrodes are directly brought into contact with the respective substrates in the first application step, the protrusion electrodes are made uniform in height by offsetting both the variation in height of the protrusion electrodes and the warpage of the substrates, so that the protrusion electrodes can be prevented from varying in height. In particular, according to the aspect of the present invention, no ultrasonic vibration is applied to the protrusion electrodes. This makes it possible to avoid excessive deformation of the protrusion electrodes which is caused by a reduction in rigidity of the protrusion electrodes due to an ultrasonic vibration.

According to the flip-chip bonding method in accordance with the aspect of the present invention, a part of a tip of a protrusion electrode is already deformed at the start of application to the protrusion electrode of an ultrasonic vibration. Thus, there is no fear that the protrusion electrode is rapidly crushed at a moment at which the ultrasonic vibration is applied to the protrusion electrode. As a result, even in a case where the ultrasonic vibration is applied to the protrusion electrode, the protrusion electrode has a sufficient area of contact between the protrusion electrode and a connecting terminal of a substrate. This makes it possible to efficiently form a newly-formed surface which contributes to bonding between the protrusion electrode and the connecting terminal of the substrate, so that a favorable bonding surface is formed between the protrusion electrode and the connecting terminal of the substrate. This causes protrusion electrodes to be uniformly pressed against respective connecting terminals of the substrate, so that an ultrasonic vibration can be sufficiently transmitted to all of the protrusion electrodes. This allows the protrusion electrodes to be strongly bonded to the respective connecting terminals of the substrate. According to the above flip-chip bonding method, which has higher productivity than a conventional flip-chip bonding method, even in a case where the connecting terminals of the electronic component element are minute, favorable bonding surfaces can be formed between the protrusion electrodes and the respective connecting terminals of the substrate, regardless of a variation in height of the protrusion electrodes or warpage of the substrate. This makes it possible to obtain bonding surfaces with high reliability of connection and high quality.

The flip-chip bonding method in accordance with an aspect of the present invention can be configured such that the part of the protrusion electrode which part is deformed by the application of the first pressure in the first application step is substantially one third in length of the protrusion electrode from a tip of the protrusion electrode.

The method allows protrusion electrodes to be flattened while the protrusion electrodes can have a sufficient height. The protrusion electrodes, which have a sufficient height, can prevent a gap between the electronic component element and the substrate from being partially narrow by being influenced by the warpage of the substrate. That is, it is possible to prevent a problem such that, during a sealing step after flip-chip bonding, a sealing resin is less flowable in the gap between the electronic component element and the substrate and thus an air bubble remains in the gap.

With the method, it is possible to prevent non-uniformness in shape among the protrusion electrodes due to an inclination of the protrusion electrodes which is caused by a distortion in the protrusion electrodes with respect to a direction of an ultrasonic vibration. This makes it possible to form a strong bonding surface between the electrodes of the electronic component element and the respective electrodes of the substrate.

The flip-chip bonding method in accordance with an aspect of the present invention can be configured such that: the protrusion electrode is an electrically conductive two-stage bump which is made up of a first bump and a second bump stacked on the first bump; and in the first application step, a part of the second bump is deformed by the application of the first pressure.

With the method, the protrusion electrode which is the two-stage bump has a high height. Accordingly, in a case where second bumps are deformed in the first application step, two-stage bumps can be made uniform in height and have a height in conformity with warpage of the substrate. That is, even in a case where the two-stage bumps vary in height or the substrate warps or waves, the two-stage bumps are made uniform in height by offsetting both a variation in height of the two-stage bumps of the electronic component element and the warpage or waviness of the substrate, so that the two-level bumps can be prevented from varying in height. Further, the second application step causes the second bump to intrude into the first bump, so that the first bump adheres to the second bump and a favorable bonding surface is formed between the two-stage bump and the connecting terminal of the substrate.

The flip-chip bonding method in accordance with an aspect of the present invention can be configured such that: the connecting terminal of the substrate is larger than the electrode of the electronic component element; and the first bump has a lower height and a smaller diameter than the second bump.

The method causes deformation of the second bump to be a principal factor in bonding and allows the first bump which is not excessively deformed to serve as a stopper for securing an overall height of the bump. In particular, since the first bump cannot be excessively deformed from the viewpoint of damage to the electrode of the electronic component element, the second bump serves as a principal factor in the deformation. In order to cause the second bump to serve as a principal factor in the deformation, it is preferable not to allow deformation of the first bump, i.e., to prevent deformation of the first bump by causing the first bump to have a lower height than the second bump. Since the second bump is a principal factor in the deformation and the bonding, the connecting terminal of the substrate which connecting terminal faces the second bump is preferably larger than the electrode of the electronic component element.

A method for producing a solid-state image pickup apparatus in accordance with an aspect of the present invention can be carried out by including any one of the flip-chip bonding methods described above.

The method allows an electrode of a solid-state image pickup device to be bonded to a connecting terminal of a circuit substrate via a protrusion electrode so that the electrode of the solid-state image pickup device is in uniform contact with the connecting terminal of the circuit substrate, and allows the electrode of the solid-state image pickup device to be bonded to the connecting terminal with a favorable bonding strength.

INDUSTRIAL APPLICABILITY

A flip-chip bonding method in accordance with the present invention can be suitably used in bonding of a solid-state image pickup device (a photoelectric conversion element) such as a CCD (charge-coupled device) in an image pickup apparatuses which are widely used, for example, in a vehicle, for an information communication terminal, and for medical purposes.

The concrete embodiments and examples discussed in the detailed explanation serve solely to illustrate the technical details of the present invention and should not be narrowly interpreted within the limits of such concrete embodiments and examples, but rather may be altered to apply within the spirit of the present invention and the scope of the claims described below.

REFERENCE SIGNS LIST

1: Electronic component element
2: Bump
3: Tool
4: Substrate
5: Electrode
6: First bump
7: Second bump
8: Two-stage bump
9: Stage
10: Flip-chip bonding device
11: Tool driving section
12: Stage driving section
13: Ultrasonic vibrator
16: Control system

The invention claimed is:

1. A flip-chip bonding method for bonding an electrode of an electronic component element to a connecting terminal of a substrate via a protrusion electrode, said flip-chip bonding method comprising:
forming the protrusion electrode comprising plural electrically conductive bumps by at least:
forming a first bump to have a height $H1$ and a diameter $R1$, the height $H1$ being measured from a surface on which the first bump is formed; and thereafter
forming a second bump stacked on the first bump, the height $H1$ of the first bump being less than a height $H2$ of the second bump and the diameter $R1$ of the first bump being less than a diameter $R2$ of the second bump, the height $H2$ of the second bump being measured from a top surface of the first bump;
aligning the electronic component element with the substrate; and then
while heating at least one of the electrode of the electronic component element and the connecting terminal of the substrate, bringing the electrode of the electronic component element into contact with the connecting terminal of the substrate via the protrusion electrode; and then
deforming a part of the protrusion electrode by applying no ultrasonic vibration to the protrusion electrode but applying, to the protrusion electrode, a first pressure which is not less than a yield stress of a bulk material of which the protrusion electrode is made, and thereby deforming a part of the second bump by the application of the first pressure;
reducing or stopping the application of the first pressure; and then
while applying a given ultrasonic vibration to the protrusion electrode, gradually applying a pressure to the protrusion electrode until the pressure reaches a second pressure which is not less than the yield stress of the bulk material of which the protrusion electrode is made;
in the forming of the protrusion electrode, the protrusion electrode being formed so that the first bump is formed on the electrode of the electronic component element or the second bump is formed on the connecting terminal of the substrate.

2. The method of claim 1, further comprising using a first metal ball for forming the first bump and using a second metal ball for forming the second bump.

3. The method of claim 1, wherein each of the first bump and the second bump comprise plural stage portions.

4. The method of claim 3, wherein each of the first bump and the second bump comprise:
a first stage portion correspond to a pedestal portion of the respective bump;
a second stage portion having a shape corresponding to a capillary employed to form the respective bump.

5. A method for producing a solid-state image pickup apparatus comprising a flip-chip bonding method recited in claim 1.

6. A solid-state image pickup apparatus produced by the method of claim 1.

7. A solid-state image pickup apparatus produced by the method of claim 2.

8. A solid-state image pickup apparatus produced by the method of claim 3.

9. A solid-state image pickup apparatus produced by the method of claim 4.

* * * * *